US010990347B2

United States Patent
Montisano

(10) Patent No.: US 10,990,347 B2
(45) Date of Patent: Apr. 27, 2021

(54) ATV MOBILE STEREO INSERT

(71) Applicant: Jon Michael Montisano, Saint George, UT (US)

(72) Inventor: Jon Michael Montisano, Saint George, UT (US)

( * ) Notice: Subject to any disclaimer, the term of this patent is extended or adjusted under 35 U.S.C. 154(b) by 142 days.

(21) Appl. No.: 16/423,103

(22) Filed: May 27, 2019

(65) Prior Publication Data

US 2020/0379710 A1 Dec. 3, 2020

(51) Int. Cl.
| | |
|---|---|
| *B60R 11/02* | (2006.01) |
| *H04R 3/00* | (2006.01) |
| *B60R 11/00* | (2006.01) |
| *G06F 3/16* | (2006.01) |
| *H03F 3/181* | (2006.01) |

(52) U.S. Cl.
CPC .......... *G06F 3/162* (2013.01); *B60R 11/0205* (2013.01); *H04R 3/00* (2013.01); *B60R 2011/0005* (2013.01); *B60R 2011/0059* (2013.01); *B60Y 2200/20* (2013.01); *H03F 3/181* (2013.01); *H03F 2200/03* (2013.01); *H04R 2420/07* (2013.01); *H04R 2499/13* (2013.01)

(58) Field of Classification Search
CPC ................. G06F 3/162; B60R 11/0205; B60R 2011/0005; B60R 2011/0059; H04R 3/00; H04R 2420/07; H04R 2499/13; H03F 2200/03; H03F 3/181; B60Y 2200/20
See application file for complete search history.

(56) References Cited

U.S. PATENT DOCUMENTS

| | | | | |
|---|---|---|---|---|
| 2004/0109575 | A1* | 6/2004 | Thigpen | H04R 5/02 381/302 |
| 2011/0156515 | A1* | 6/2011 | Tsung | H02K 5/10 310/88 |
| 2013/0197753 | A1* | 8/2013 | Daly | H04B 1/202 701/36 |
| 2018/0227654 | A1* | 8/2018 | Majkowski | B60Q 3/82 |
| 2018/0236873 | A1* | 8/2018 | Nguyen | B60R 11/0241 |

* cited by examiner

*Primary Examiner* — Michael C Zarroli

(57) ABSTRACT

A custom-made amplified mini stereo device specifically designed and crafted to fit into ATV/recreational vehicles dash panels.

1 Claim, 2 Drawing Sheets

Figure 1:
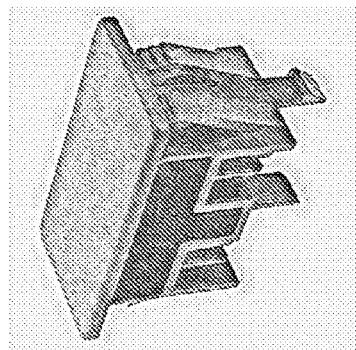

1
(Device installed in sample dashboard)

Device: ATV Mobile Bluetooth Stereo Insert 1 (Box)

2 (Lid/Cover)

1 (Circuit Board)

1 (LED lamp)

2 (Toggle Switch)

1 (Device installed in sample dashboard)

ATV MOBILE STEREO INSERT

FIELD

The present application relates to a small, simple, inexpensive audio stereo Bluetooth (BT) device for use in ATV/recreational vehicles

BACKGROUND

ATV recreational vehicles typically are exposed to harsh and dusty conditions. Most aftermarket media players and stereos tend to be large, delicate and expensive devices. These highly fragile and costly audio stereos can be easily scratched or damaged by routine use, and are complex for the typical end user to install. Users seeking a small simple to install low investment alternative have very few unique clean looking choices.

SUMMARY

This device is intended for use on all ATV/UTV off road vehicles, as well as any other vehicles that use the Carling VH2-01 (or similar) dash blank/hole plug, or have an appropriately made rectangular cutout in the dash mounting area.

This small dash insert box was designed to house a miniature stereo Bluetooth amplifier module, which is powered by the vehicles 12 VDC electrical system and has a simple six wire installation.

The assembled device plugs into any rectangular slot in place of the dash hole cover or user made cutout, and through its internal BT stereo amplifier, permits the user to pair with their phone (or other Bluetooth audio device player) and play music or other audio media through the vehicle's speakers.

BRIEF DISCRIPTION OF THE DRAWINGS

In the following detailed portion of the present description, the teachings of the present application will be explained in more detail with reference to the example embodiments shown in the drawings, in which:

FIG. 1 is a view of a Carling VH2-01 (or similar) dash blank/hole plug.

Figure 2:
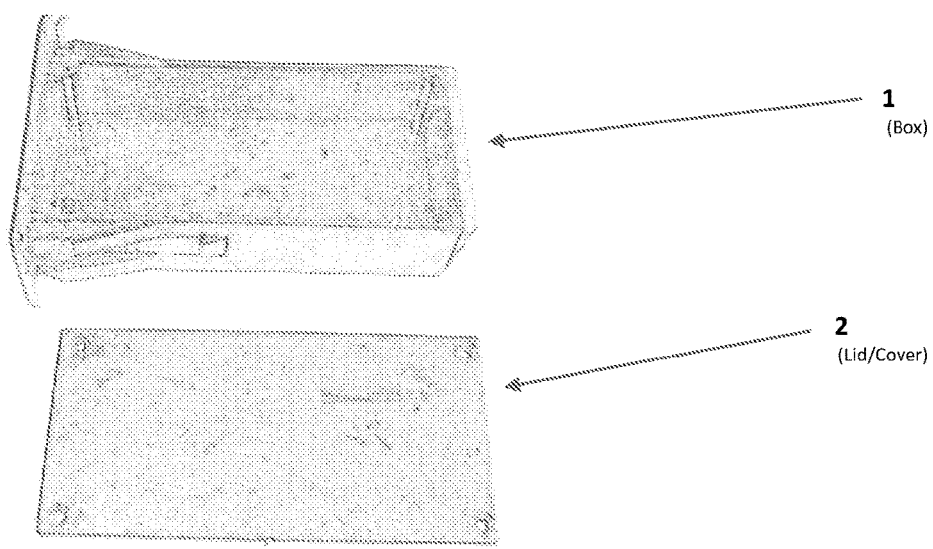

FIG. 2. is a view of the custom-made ABS injected module box (1) and side cover (2).

Figure 3:
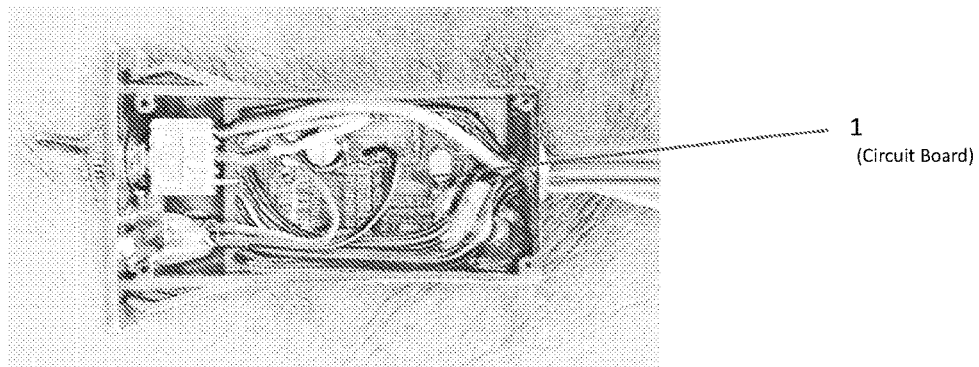

FIG. 3. is a view of the assembled module box and the internal Bluetooth stereo amplifier (1) and components.

Figure 4:
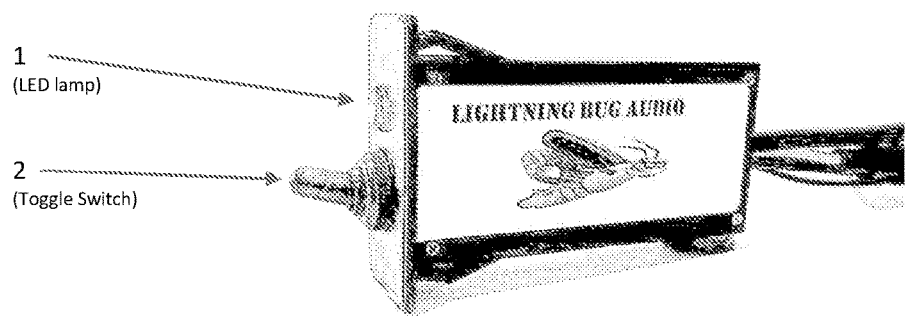

FIG. 4. is a view of the fully assembled device ready for installation, with LED lamp (1) and power toggle switch (2) on the front panel.

Figure 5:
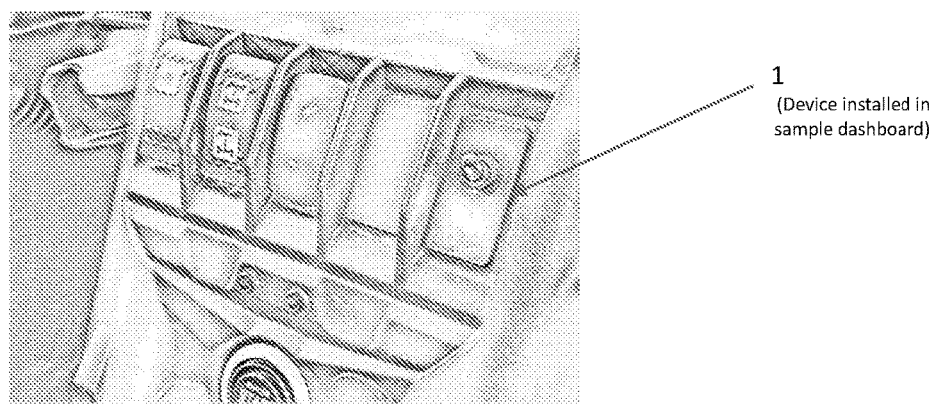

FIG. 5. is a view of the device installed in the ATV dashboard (1).

DETAILED DISCRIPTION

The first embodiment of the ATV mobile Bluetooth stereo is the use of a custom ABS injection molded box and lid as shown in FIG. 2 to assemble the components into.

The device is assembled by first drilling holes in the front face of the custom ABS box for mounting of a power indicator LED and power toggle switch. The rear is also drilled with a hole to allow a rubber strain relief grommet to protect the wiring from chaffing.

The BT audio module is prepped by soldering appropriate speaker and power wires to the circuit board. The power switch and LED indicator are also subsequently wired to the circuit board. All components are then installed into the custom ABS box, and the box lid is secured with four micro screws.

The main component, the mini BT stereo (Dual channel 2.0) module, has a 15-30 watt output when using speakers of 4-8 ohms. The BT stereo module has an operating voltage range of 7.5-25 VDC, and a current draw of less than 2.0 amperes.

Size: approx. 72 mm×48 mm

Assembled weight: approx. 28 g

The invention claimed is:

1. A dash box/insert designed for all-terrain vehicles (ATV) comprising;
    fabricated of acrylonitrile butadiene styrene (ABS),
    a blue LED indicator on a front panel of the dash/box insert,
    a waterproof power toggle switch on the front panel,
    a stereo amplifier module with wireless communication and control using smart devices such as cell phones,
    self-retaining friction legs on the top and bottom of the dash/box insert designed for mounting of the dash/box insert within an existing ATV panel.

* * * * *